United States Patent
Chen

(10) Patent No.: US 6,919,582 B2
(45) Date of Patent: Jul. 19, 2005

(54) TRI-COLOR ZNSE WHITE LIGHT EMITTING DIODE

(75) Inventor: Hsing Chen, Jubei Hsinchu (JP)

(73) Assignee: Solidlite Corporation, Shin Chu (TW)

( * ) Notice: Subject to any disclaimer, the term of this patent is extended or adjusted under 35 U.S.C. 154(b) by 47 days.

(21) Appl. No.: 10/719,089

(22) Filed: Nov. 20, 2003

(65) Prior Publication Data

US 2005/0110035 A1 May 26, 2005

(51) Int. Cl.$^7$ .................................................. H01L 27/15
(52) U.S. Cl. ............................. 257/79; 257/98; 257/99; 257/103
(58) Field of Search ...................... 257/79–103

(56) References Cited

U.S. PATENT DOCUMENTS 6,600,175 B1 * 7/2003 Baretz et al. ............... 257/100
6,680,568 B2 * 1/2004 Fujiwara et al. ............ 313/501

* cited by examiner

Primary Examiner—Long Pham
Assistant Examiner—Wai-Sing Louie
(74) Attorney, Agent, or Firm—Pro-Techtor International Services

(57) ABSTRACT

A Tri-color ZnSe white light emitting diode includes at least a ZnSe LED chip, a blue emission layer, and a green fluorescent powder. Each of ZnSe LED chip is a white light source. The blue emission layer is formed on the ZnSe LED chip to emit blue wavelength light, which shines the ZnSe LED chip to produce yellow light. The green fluorescent powder is covered onto ZnSe LED chip capable of absorbing blue light emitted from the blue emission layer to emit green wavelength light, so that mixing the blue light, yellow light, and green light to produce the white light emitting diode.

9 Claims, 6 Drawing Sheets

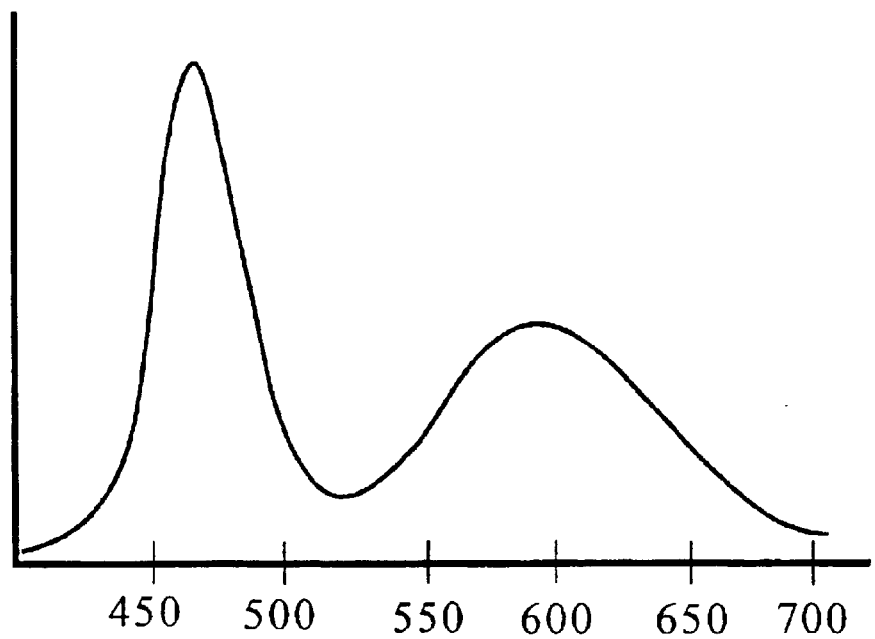
PRIOR ART FIG. 1
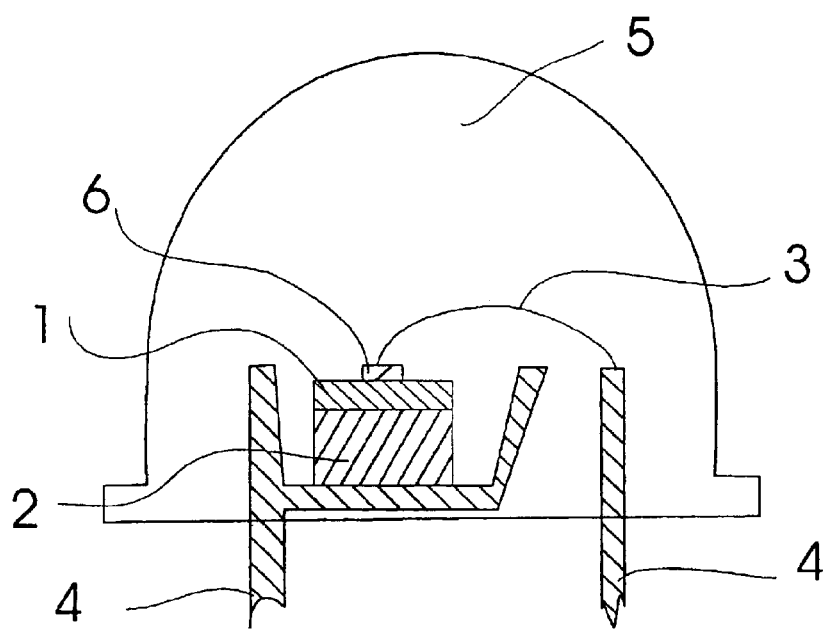
PRIOR ART FIG. 2

TRI-COLOR ZNSE WHITE LIGHT EMITTING DIODE

BACKGROUND OF THE INVENTION

1. Field of the Invention

The present invention relates to a white light emitting diode used in LED display, back light source, traffic signal, indicator, etc. and in particular to a Tri-color ZnSe white light emitting diode.

2. Description of the Related Art

The light emitting diode (LED) has the advantages of being electricity-saving, high reliability, recyclable, and safety. Thus it has been used widely in applications such was various indicators and various light sources. Recently light emitting diode for RGB(red, green and blue) colors having ultra-high luminance and high efficiency have been developed; and large screen LED displays using these light emitting diode have been put into use. The LED display can be operated with less power and has such good characteristics as light weight and long life, and is therefore expected to be more widely use in the future.

A traditional method of manufacturing white light emitting diode, is to use at least two chips to emit different wavelength light, mixing the different wavelength light to produce white light emitting diode.
The method has a following drawbacks 1. The at least two chips must be packaged at the same time, thus, the manufacturing processes is complicated and the manufacture cost is high.
2. Since the material of each chip for different color of diode is different, the forward voltage (Vf) of every chip is different, therefore, the circuit of the each chip must add the different forward circuit to adjust its brightness and color.

Furthermore, a traditional method of manufacturing white light emitting diode, is to provide a fluorescent powder coated on the surface of LED chip. The fluorescent powder is capable of absorbing a part of light emitted by LED chip (as blue light et.) and emitted light of a wavelength different from that of the absorbed light to produce another kind of color light. Mixing the emitted light and the absorbed light to produce white light.

Please refer to FIG. 1. It is a diagram showing a traditional emission spectrum of ZnSe white light emitting diode. The method of manufacturing white light emitting diode is to use blue emission layer to produce blue light, which shines a ZnSe chip to produce yellow light, mixing blue light, yellow light to produce white light emitting diode.

Please refer to FIG. 2. It is a cross-sectional view showing a traditional ZnSe white light emitting diode lamp includes a SnZe blue emission layer 1, a ZnSe LED chip 2, wires 3, a lead frame 4, compound resin 5, and an electrode pads 6. The ZnSe LED chip 2 is mounted to the lead frame 4. The SnZe blue emission layer1 is formed on the ZnSe LED chip 2. Wires 3 are electrically connected the electrode pads 6 to the lead frame 4. The compound resin 5 is covered onto the SnZe LED chip 2. So the blue light emitted form the blue emission layer 1 shines the ZnSe LED chip 2 to produce yellow light, mixing blue light and yellow light to produce white light.

At present time, a mixing light is used to white light, which is providing a yellow fluorescent coated on the surface of a blue LED chip to emit yellow light. Mixing the yellow light and the blue light produces white light. For example, the patent of a white light emitting diode (U.S. Pat. No. 5,998,925) of Nichia corporation.

Further, a method of manufacturing mixing light is to mix a red fluorescent powder, blue fluorescent powder, and green fluorescent powder coated on a purple LED chip with a wavelength ranging from 360 nm to 390 nm to produce white light or various color, of light. For example, the patent of U.S. Pat. No. 5,952,684 of Solidlite corporation.

SUMMARY OF THE INVENTION

The objective of the present invention is to provide a Tri-color ZnSe white light emitting diode. It is manufactured conveniently, the manufacturing processes is simplified and the manufacturing cost must be decreased.

The further objective of the present invention is to provide a Tri-color ZnSe light emitting diode with a better white brighttness for a long period of time.

To achieve the above-mentioned objective, the present invention of Tri-color ZnSe white light emitting diode includes at least a ZnSe LED chip, a blue emissoin layer, and a green fluorescent powder. Each of ZnSe LED is a white light source. The blue emission layer is formed on the ZnSe LED chip to emit blue wavelength light. The green fluorescent powder is covered onto ZnSe LED chip capable of absorbing blue light emitted from the blue emission layer to emit green wavelength light, so that mixing the blue light, white light, and green light to produce the white light emitting diode.

According to one aspect of the present invention, a Tri-color ZnSe white light emitting may show a better white light and manufacturing cost must be decreased.

BRIEF DESCRIPTION OF THE DRAWINGS

FIG. 1 is a diagram showing a traditional emission spectrum of ZnSe white light emitting diode.

FIG. 2 is a cross-sectional showing a traditional ZnSe white light emitting diode lamp.

DETAILED DESCRIPTION OF THE INVENTION

Figure 3:
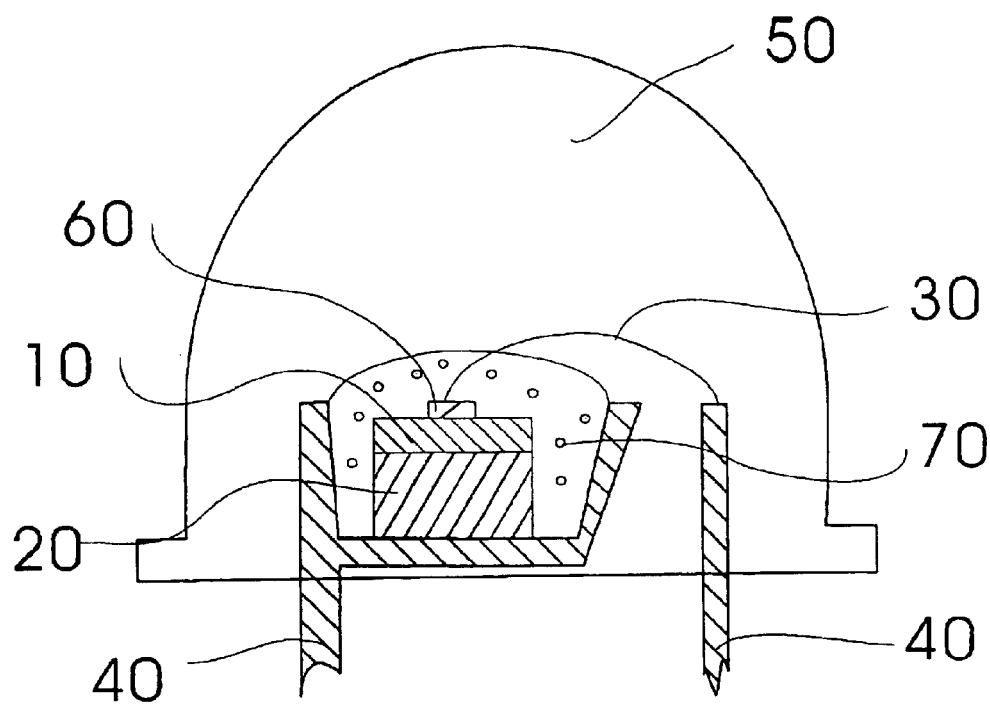
FIG. 3 is a cross-section showing the Tri-color ZnSe white light emitting diode lamp of the present invention.

Please refer to FIG. 3. It is a cross-sectional showing a Tri-color ZnSe white light emitting diode lamp of the present invention includes a ZnSe blue emission layer 10, a ZnSe LED chip 20, wires 30, lead frame 40, compound resin 50, electrode pad 60 and a green fluorescent powder 70.

The ZnSe blue emission layer 10 is formed on the ZnSe LED chip 20 to produce blue emitted light, which shines the ZnSe LED chip 20 to produce yellow light.

In the embodiment, at least includes a ZnSe LED chip 20, which is a white light source, is mounted to a substrate (such as a lead frame 40) and electrically connected electrode pad 60 to the lead frame 40 by wires 30.

The green fluorescent layer 70 is coated to the ZnSe LED chip 20, capable of absorbing blue light emitted from the ZnSe blue emission layer 10 to produce green emitting light.

The compound resin 50 is covered on the ZnSe LED chip 20.

Mixing the yellow light, blue light, and the green emitting light to produce Tri-color ZnSe white light emitting diode.

Figure 4:
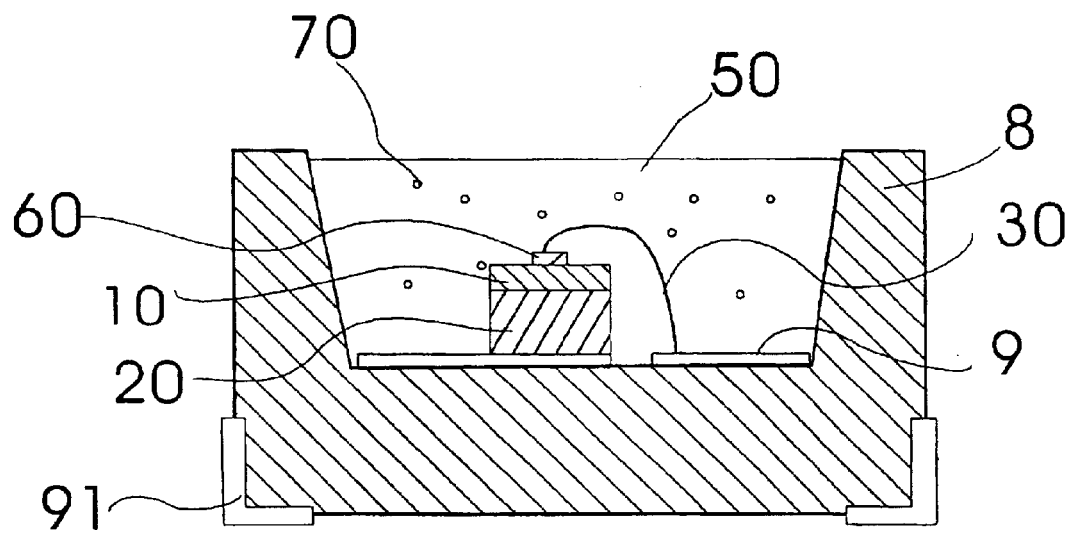
FIG. 4 is the schematic illustration showing the top view Tri-color ZnSe white light emitting diode of the present invention.

Please refer to FIG. 4. It is further a schematic illustration showing a Tri-color ZnSe white light emitting diode of the present invention. Wherein the ZnSe LED chip 20 is mounted on a substrate 8, which has an internal electrode 9 and an external electrode 10.

Figure 5:
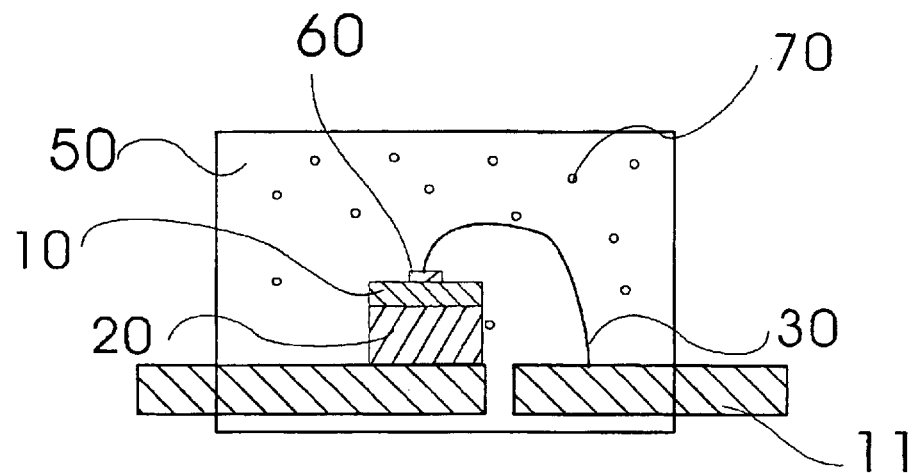
FIG. 5 is the schematic illustration showing the SMD type Tri-color ZnSe white light emitting diode of the present invention.

Please refer to FIG. 5. It is a third schematic illustration showing a Tri-color ZnSe white light emitting diode of the present invention. Wherein the ZnSe LED chip 20 is mounted on a lead fame 10 by SMT.

Figure 6:
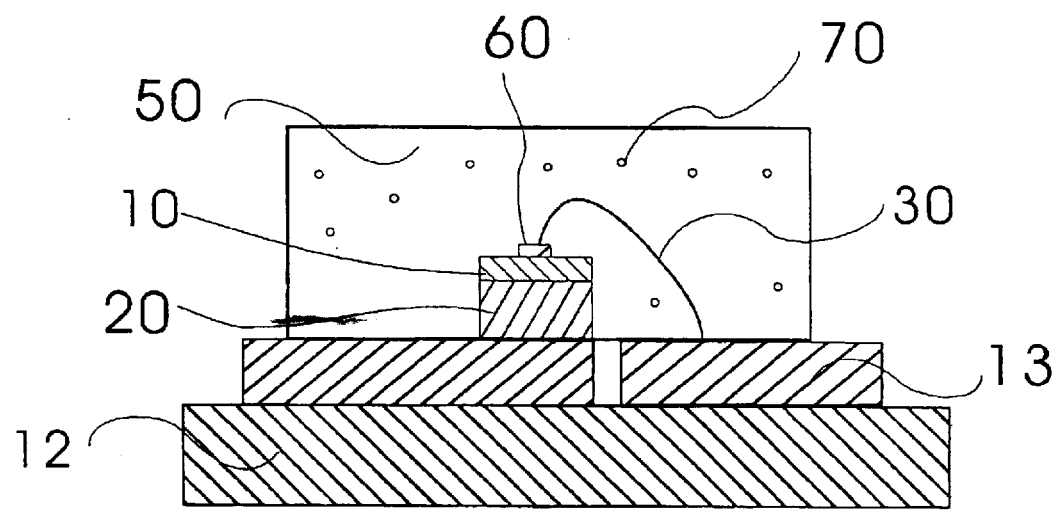
FIG. 6 is the schematic illustration showing the PCB type Tri-color ZnSe white light emitting diode of the present invention.

Please refer to FIG. 6. It is a fourth schematic illustration showing a Tri-color ZnSe white light emitting diode of the present invention. Wherein the ZnSe LED chip 20 is mounted on a printed circuit board 12.

Wherein the wavelength of blue light emitted is in a region of 420 nm–480 nm.

The green fluorescent powder 70 includes at least a component of $Y_3(Ga_xAl_{1-x})_5O_{12}:Ce(0<x<1)$; $Ca_8Mg(SiO_4)_4Cl_2:Eu, Mn$; $Ca_2MgSi_2O_7:Cl, Eu$; $Ba_2(Mg_xZn_{1-x})Si_2O_7:Eu$.

Figure 7:
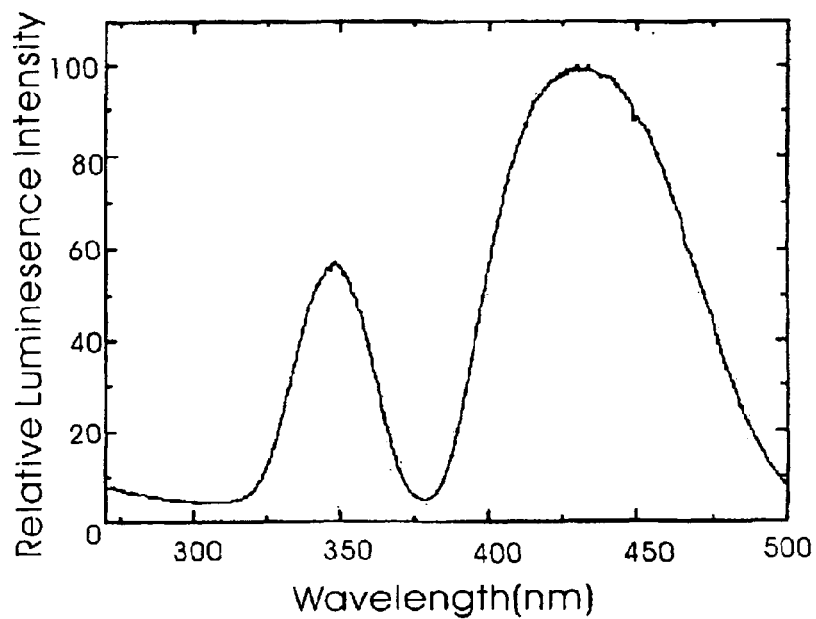
FIG. 7 is a diagram showing an emitting spectrum of $Y_3(Ga_xAl_{1-x})_5O_{12}:Ce(0<x<1)$ of green fluorescent powder of Tri-color ZnSe white light emitting diode of the present invention.
Figure 8:
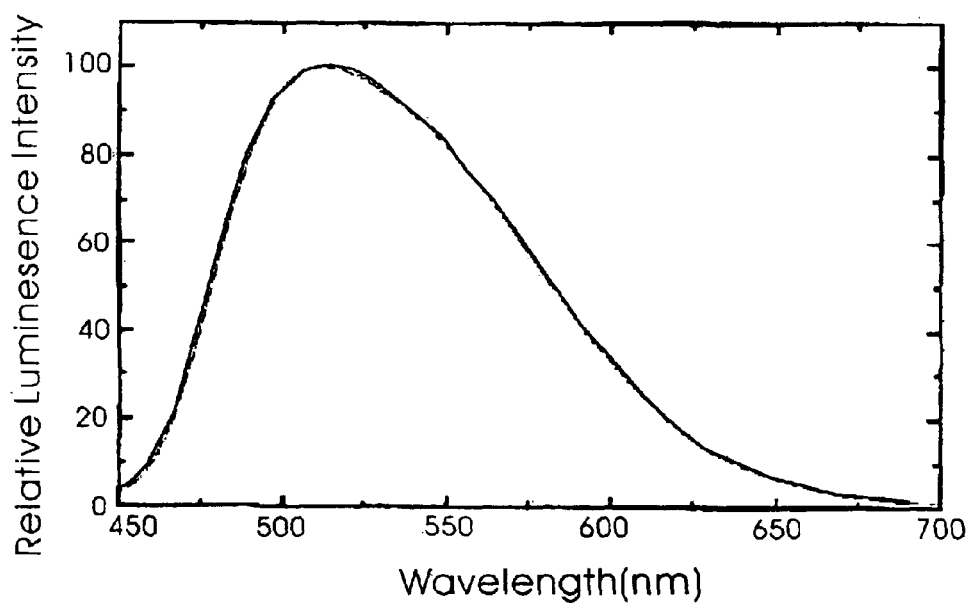
FIG. 8 is a diagram showing an emission spectrum of $Y_3(Ga_xAl_{1-x})_5O_{12}:Ce(0<x<1)$ of green fluorescent powder of Tri-color white light emitting diode of the present invention.

Please refer to FIG. 7 and FIG. 8, wherein the green fluorescent powder 70 is a component of $Y_3(Ga_xAl_{1-x})_5O_{12}:Ce(0<x<1)$ to emit green light emitted wavelength is in a region of 500 nm–550 nm.

Figure 11:
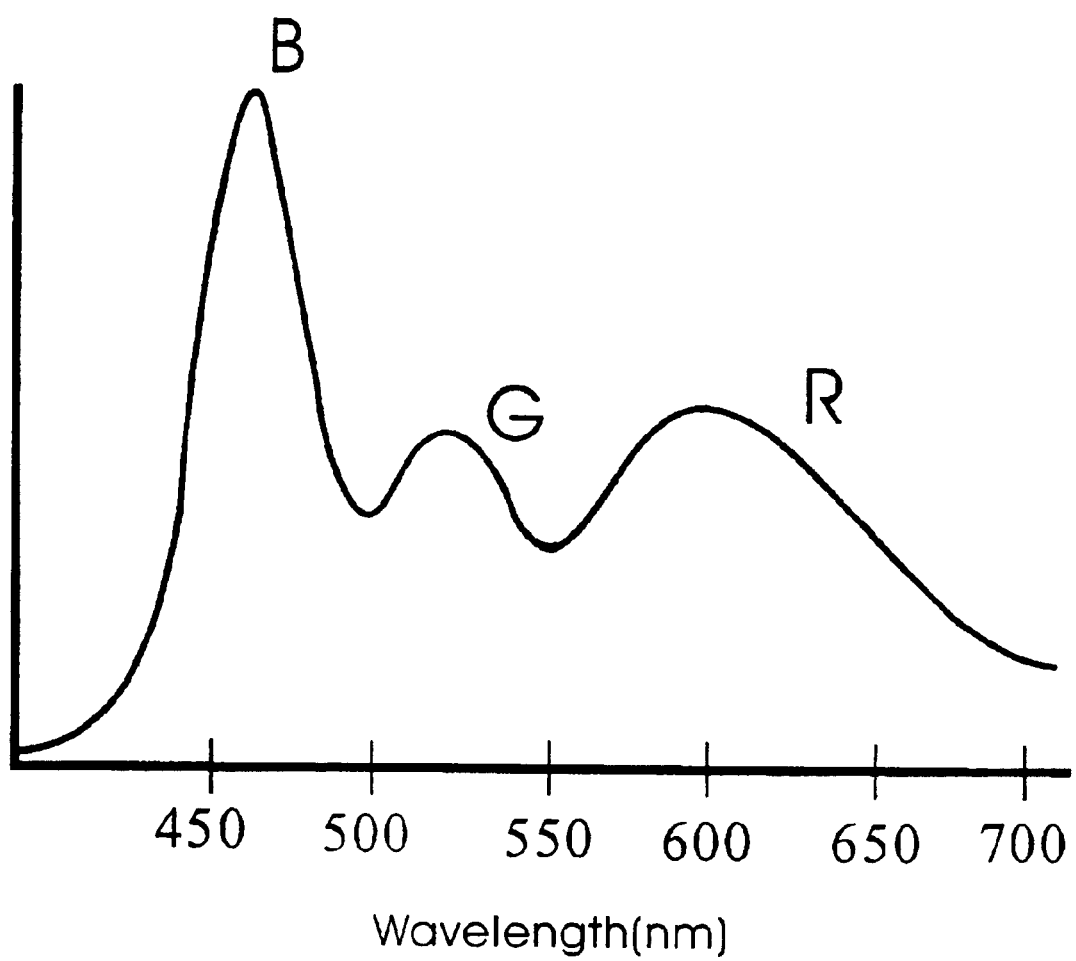
FIG. 11 is a diagram showing an emission spectrum of Tri-color ZnSe white light emitting diode of the present invention.

Please refer to FIG. 11. It is a diagram showing an emission spectrum of Tricolor ZnSe white light emitting diode of the present invention, is used to ZnSe LED chip coated with green fluorescent powder 70 to emit a white light emitting diode.

Figure 9:
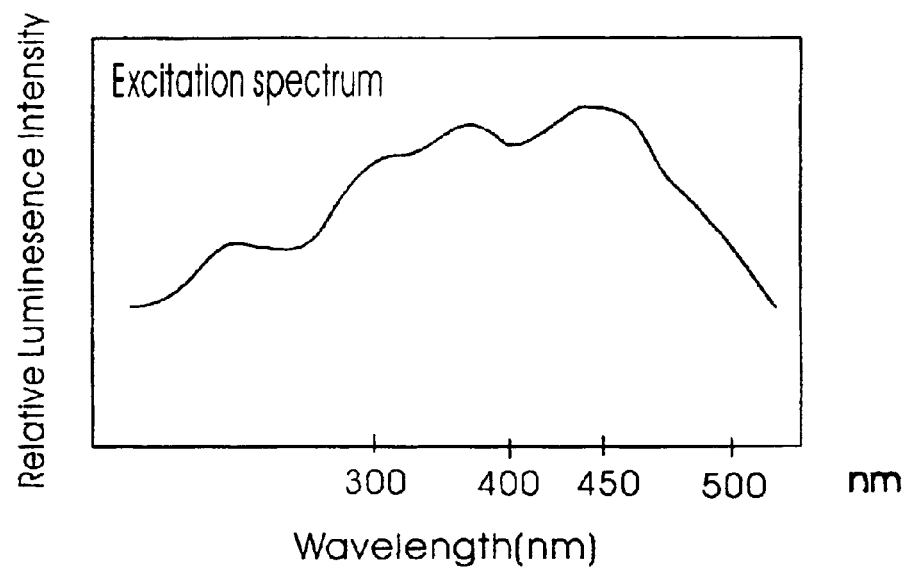
FIG. 9 is a diagram showing an emitting spectrum of $Ca_8Mg(SiO_4)_4Cl_2:Eu, Mn$ of green fluorescent powder of Tri-color ZnSe white light emitting diode of the present invention.
Figure 10:
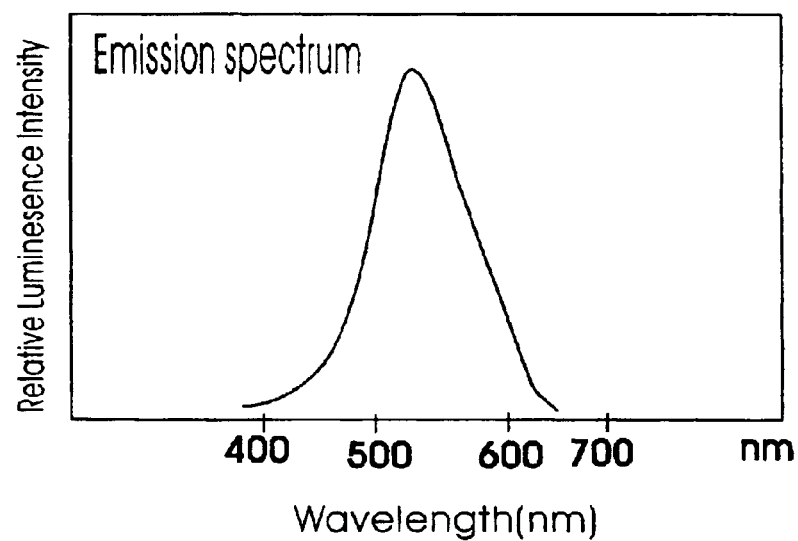
FIG. 10 is a diagram showing an emission spectrum of $Ca_8Mg(SiO_4)_4Cl_2:Eu, Mn$ of $Ca_8Mg(SiO_4)_4Cl_2:Eu, Mn$ of green fluorescent powder of Tri-color ZnSe white light emitting diode of the present invention.

Please refer to FIG. 9 and FIG. 10. In another embodiment, the green fluorescent powder 70 is a component of $Ca_8Mg(SiO_4)_4Cl_2:Eu, Mn$ to emit the light of wavelength is in a region of 515 nm.

Therefore, the Tri-color ZnSe white light emitting diode of the present invention has the following advantages.

1. Since the green fluorescent powder is an Oxide, so as to white light emitting diode of the present invention has high stability in use, lower cost, and high luminance for a long period of time.
2. Since the manufacturing processes can be simplified, and the manufacturing costs also can be lowered.
3. Since the ZnSe LED chip 20 is coated with a green fluorescent powder 70, which is emitted to produce green light emission, so that it has a better brighttness for a long period of time.

While the invention has been described by way of an example and in terms of a preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

What is claimed is:

1. A Tri-color ZnSe white light emitting diode, comprising:

at least a ZnSe LED chip;

a blue emission layer formed on the ZnSe LED chip to emit blue wavelength light, which shines the ZnSe LED chip to produce yellow light;

a green fluorescent powder being covered onto ZnSe LED chip capable of absorbing blue light emitted from the blue emission layer and emitting green wavelength light, so that mixing the blue light, yellow light, and green light to produce the white light emitting diode.

2. A Tri-color ZnSe white light emitting diode according to claim 1, wherein green fluorescent powder includes at least a component of $Y_3(Ga_xAl_{1-x})_5O_{12}:Ce(0<x<1)$; $Ca_8Mg(SiO_4)_4Cl_2:Eu, Mn$; $Ca_2MgSi_2O_7:Cl, Eu$; $Ba_2(Mg_xZn_{1-x})Si_2O_7:Eu$.

3. A Tri-color ZnSe white light emitting diode according to claim 1, wherein the blue emission light has a wavelength in a region of 420 nm–480 nm.

4. A Tri-color ZnSe white light emitting diode according to claim 1, wherein the green wavelength light has a wavelength in a region of 500 nm–550 nm.

5. A Tri-color ZnSe white light emitting diode package, comprising:

a substrate;

at least a ZnSe LED chip being mounted on the substrate and electrically connected to the substrate;

a blue emission layer formed on the ZnSe LED chip to emit blue wavelength light, which shines the ZnSe LED chip to produce yellow light;

a green fluorescent powder being covered onto ZnSe LED chip capable of absorbing blue light emitted from the blue emission layer and emitting green wavelength light, so that mixing the blue light, yellow light, and green light to produce the white light emitting diode; and a component resin being packaged on the ZnSe LED chip.

6. A Tri-color ZnSe white light emitting diode package according to claim 5, wherein green fluorescent powder includes at least a component of $Y_3(Ga_xAl_{1-x})_5O_{12}:Ce(0<x<1)$; $Ca_8Mg(SiO_4)_4Cl_2:Eu, Mn$; $Ca_2MgSi_2O_7:Cl, Eu$; $Ba_2(Mg_xZn_{1-x})Si_2O_7:Eu$.

7. A Tri-color ZnSe white light emitting diode package according to claim 5, wherein the blue emission light has a wavelength in a region of 420 nm–480 nm.

8. A Tri-color ZnSe white light emitting diode package according to claim 5, wherein the green wavelength light has a wavelength in a region of 500 nm–550 nm.

9. A Tri-color ZnSe white light emitting diode package according to claim 5, wherein the substrate may be a lead frame, a printed circuit board, a plastic material, or ceramic.

* * * * *